United States Patent
Kim et al.

(10) Patent No.: US 8,709,530 B2
(45) Date of Patent: Apr. 29, 2014

(54) PATTERN FORMING METHOD USING PRINTING DEVICE AND METHOD OF MANUFACTURING LIQUID CRYSTAL DISPLAY DEVICE USING THE SAME

(75) Inventors: Chul Ho Kim, Gyeonggi-do (KR); Tae Young Oh, Gyeonggi-do (KR); Choon Ho Park, Gyeonggi-do (KR)

(73) Assignee: LG Display Co., Ltd., Seoul (KR)

( * ) Notice: Subject to any disclaimer, the term of this patent is extended or adjusted under 35 U.S.C. 154(b) by 837 days.

(21) Appl. No.: 12/003,712

(22) Filed: Dec. 31, 2007

(65) Prior Publication Data

US 2008/0242183 A1 Oct. 2, 2008

(30) Foreign Application Priority Data

Mar. 30, 2007 (KR) .................. 10-2007-0031969

(51) Int. Cl.
- B05D 5/12 (2006.01)
- B05D 1/28 (2006.01)
- B05D 3/12 (2006.01)

(52) U.S. Cl.
USPC ............ 427/74; 427/98.4; 427/146; 427/256; 427/355; 427/428.06; 427/428.11; 427/428.15

(58) Field of Classification Search
USPC ............... 427/98.4, 146, 256, 355, 428.06, 427/428.11, 428.15, 74; 106/453, 446.1, 106/467
See application file for complete search history.

(56) References Cited

U.S. PATENT DOCUMENTS

| | | | |
|---|---|---|---|
| 4,745,416 A * | 5/1988 | Horihata ................ | 347/259 |
| 4,757,763 A * | 7/1988 | MacPhee et al. ............ | 101/425 |
| 6,029,575 A * | 2/2000 | Bischer ................ | 101/425 |
| 6,729,230 B1 * | 5/2004 | Okawa et al. ............ | 100/73 |
| 6,835,583 B2 * | 12/2004 | Yi et al. ................ | 438/30 |
| 7,546,803 B2 * | 6/2009 | Konaka et al. ............ | 101/424 |
| 7,658,147 B2 * | 2/2010 | Chung et al. ............ | 101/483 |
| 7,927,669 B2 * | 4/2011 | Schlatterbeck et al. ...... | 427/510 |
| 2004/0135944 A1 * | 7/2004 | Kim ................ | 349/113 |
| 2004/0173114 A1 * | 9/2004 | Suda et al. ............ | 101/467 |
| 2004/0224150 A1 * | 11/2004 | Hiramatsu et al. ........... | 428/343 |
| 2007/0151469 A1 * | 7/2007 | Jeong ............... | 101/215 |
| 2007/0175349 A1 * | 8/2007 | Konaka et al. ............ | 101/425 |
| 2009/0208661 A1 * | 8/2009 | Kim et al. ............ | 427/428.01 |

FOREIGN PATENT DOCUMENTS

| | | | |
|---|---|---|---|
| JP | 05-011270 | * | 1/1993 |
| JP | 06-305108 | * | 11/1994 |
| JP | 2002023143 A | | 1/2002 |
| JP | 2005353770 A | | 12/2005 |
| KR | 1020040081253 A | | 9/2004 |

OTHER PUBLICATIONS

Korean Office Action in counterpart Korean Application No. 10-2007-0031969, dated Nov. 25, 2012.

* cited by examiner

*Primary Examiner* — Brian K Talbot
(74) *Attorney, Agent, or Firm* — Morgan, Lewis & Bockius LLP

(57) ABSTRACT

A pattern forming method using printing device and method of manufacturing LCD device using the same is disclosed, which uses a cleaning dry film to remove a pattern material from a printing plate, the printing device comprising a printing roller coated with a pattern material; a printing plate including embossing and depressed patterns for patterning the pattern material of the printing roller; a substrate to which the pattern material on the embossing patterns of the printing roller is transcribed; and a cleaning unit, for removing the pattern material from the printing plate, provided with a film-supplying roller, a cleaning roller and a film-collecting roller combined with one another by one cleaning dry film.

6 Claims, 3 Drawing Sheets

PATTERN FORMING METHOD USING PRINTING DEVICE AND METHOD OF MANUFACTURING LIQUID CRYSTAL DISPLAY DEVICE USING THE SAME

CROSS-REFERENCE TO RELATED APPLICATION

The present application claims priority under 35 U.S.C. §119 to Korean Patent Application No. 10-2007-0031969 filed on Mar. 30, 2007, which is hereby incorporated by reference in its entirety.

BACKGROUND OF THE INVENTION

1. Field of the Invention

The present invention relates to a pattern forming method using printing device and method of manufacturing LCD device using the same.

2. Discussion of the Related Art

Recently, various flat panel display devices have been developed to overcome disadvantageous properties of Cathode Ray Tube (CRT), that is, the large weight and size. For example, the various flat panel display devices include a liquid crystal display (LCD) device, a field emission display (FED), a plasma display panel (PDP), and an electro-luminescence (EL) display device.

The flat panel display device includes a plurality of thin films which are formed by mask steps inclusive of deposition (coating), exposure, development and etching. However, the mask steps may cause the complicated process and increasing fabrication cost. In this respect, there are increasing researches and studies for a method to form the thin film by a printing process using a printing roller.

The printing process is comprised of forming a predetermined pattern on a printing roller by using a printing plate; and transcribing the predetermined pattern to a substrate so as to form a desired pattern thereon.

Since the predetermined pattern is formed on the printing roller, and some of the predetermined pattern remains on the printing plate, it necessarily requires a cleaning process including steps of moving the printing plate having the remaining pattern material to a cleaning unit and removing the pattern material from the printing plate by the cleaning unit.

However, the cleaning process uses a cleaning liquid to clean the printing plate, which is performed until the pattern material is removed from the printing plate, thereby causing a problem of increasing cleaning time.

The cleaning unit using the cleaning liquid may have the problem of more increasing cost due to the steps of supplying and discharging the cleaning liquid, and consumption of the expensive cleaning liquid, as compared to the cleaning unit which doesn't use the cleaning liquid.

SUMMARY OF THE INVENTION

Accordingly, the present invention is directed to a pattern forming method using printing device and method of manufacturing LCD device using the same that substantially obviates one or more problems due to limitations and disadvantages of the related art.

An object of the present invention is to provide a printing device which uses a cleaning dry film to remove a pattern material from a printing plate, and a pattern forming method using the same.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a printing device comprises a printing roller coated with a pattern material; a printing plate including embossing and depressed patterns for patterning the pattern material of the printing roller; a substrate to which the pattern material on the embossing patterns of the printing roller is transcribed; and a cleaning unit, for removing the pattern material from the printing plate, provided with a film-supplying roller, a cleaning roller and a film-collecting roller combined with one another by one cleaning dry film.

At this time, the film-supplying roller, the cleaning roller and the film-collecting roller respectively rotate in the same direction, and the cleaning roller rolls on the printing plate to pass therethrough.

Also, the film-supplying roller supplies the cleaning dry film wound thereon to the cleaning roller.

The cleaning roller rotates so as to make the cleaning dry film from the film-supplying roller roll on the printing plate.

The film-collecting roller collects the cleaning dry film supplied through the cleaning roller, and winds the collected cleaning dry film therearound.

The cleaning dry film is formed of a film containing adhesive high molecular compound.

The adhesive high molecular compound is formed of mixture of acrylic resin and epoxy resin.

In addition, the printing device comprises a pattern-material coating unit to coat the pattern material on the printing roller.

In another aspect, a pattern forming method comprises rolling a printing roller coated with a pattern material on a printing plate, to make some of the pattern material left on the printing roller; rolling the printing roller having the pattern material left thereon on a substrate, to transcribe the pattern material to the substrate; and transferring a cleaning unit including a cleaning dry film to be positioned above the printing plate, and cleaning the printing plate by using the cleaning dry film of the cleaning unit.

Cleaning the printing plate by using the cleaning dry film of the cleaning unit comprises supplying the cleaning dry film of the film-supplying roller to the cleaning roller; rolling the cleaning dry film supplied to the cleaning roller on the printing plate, so as to make the pattern material of the printing plate stick to the cleaning dry film; and collecting the cleaning dry film, to which pattern material sticks, by using the film-collecting roller.

At this time, the cleaning dry film is formed of a film containing adhesive high molecular compound.

Also, the adhesive high molecular compound is formed of mixture of acrylic resin and epoxy resin.

Furthermore, the pattern forming method comprises coating the pattern material on the printing roller before rolling the printing roller on the printing plate.

At this time, rolling the printing roller coated with the pattern material on the printing plate, to make some of the pattern material left on the printing roller, comprises rolling the printing roller coated with the pattern material on the printing plate including embossing and depressed patterns therein, to make some of the pattern material transcribed to the depressed patterns of the printing plate, and to make the pattern material corresponding to the embossing patterns left on the printing roller.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

Hereinafter, a printing device according to the present invention and a pattern forming method using the same will be explained with reference to the accompanying drawings.

Figure 1A:
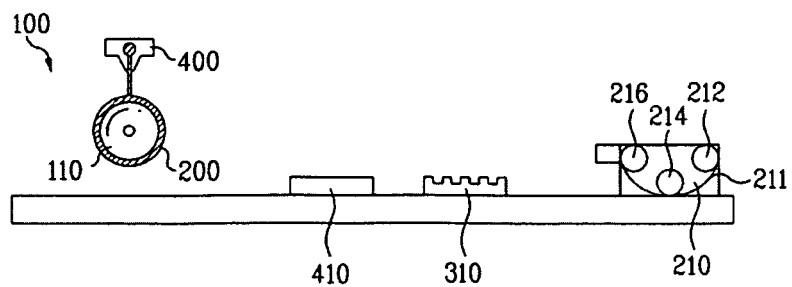
FIGS. 1A to 1D are schematic cross section diagrams illustrating a pattern forming method using a printing device according to the present invention.

FIG. 1A is a schematic diagram illustrating a printing device provided with a cleaning unit using a cleaning dry film according to the present invention.

As shown in FIG. 1A, a printing device 100 according to the present invention includes a printing roller 110, a pattern-material coating unit 400, a printing plate 310, a substrate 410, a cleaning dry film 211, and a cleaning unit 210 having three printing rollers 212, 214 and 216 therein.

The printing roller 110 includes a blanket coated with a pattern material 200. The printing roller 110 moves among the pattern-material coating unit 400, the substrate 410 and the printing plate 310 by a transfer (not shown), to thereby form the desired pattern on the substrate 410.

Through the pattern-material coating unit 400, the printing roller 110 is coated with the pattern material 200 supplied from a pattern-material supplier.

The printing plate 310 is provided with embossing and depressed patterns therein so as to pattern the pattern material 200 coated on the printing roller 110.

Figure 2:
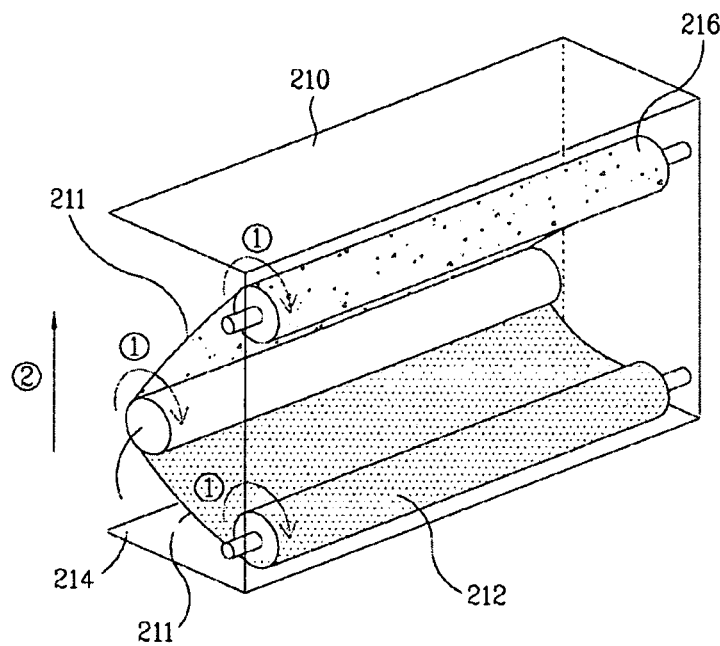
FIG. 2 is a schematic diagram illustrating a cleaning unit having three printing rollers according to the present invention.

The cleaning unit 210 removes the pattern material from the depressed patterns of the printing plate 310. As shown in FIG. 2, the cleaning unit 210 includes the three rollers comprised of the film-supplying roller 212, the cleaning roller 214, and the film-collecting roller 216 combined with one another by one cleaning dry film. At this time, both ends of the film-supplying roller 212 and the film-collecting roller 216 are fixed to the sidewall of the cleaning unit 210. To make the cleaning roller contact with the embossing and depressed patterns of the printing plate, the lower surface of cleaning unit is an open type. Also, while the rollers 212, 214 and 216 rotate in the same direction, that is, clockwise direction (rotation in the direction of ① of FIG. 2), the cleaning roller 214 rolls on the entire embossing and depressed patterns of the printing plat 310 (rotation in the direction of ② of FIG. 2), simultaneously.

To remove solvent included in the pattern material of the printing plate, the cleaning dry film is formed of a film containing adhesive high molecular compound, preferably. For example, the adhesive high molecular compound may be made of mixture of acrylic resin and epoxy resin.

In this case, the cleaning dry film 211 is wound on the film-supplying roller 212, wherein the cleaning dry film 211 removes the pattern material from the depressed patterns of the printing plate. The film-supplying roller 212 rotates in the clockwise direction, to supply the cleaning dry film 211 to the cleaning roller 214.

The cleaning roller 214 winds the cleaning dry film 211 supplied from the film-supplying roller 212, so as to make the cleaning dry film 211 pass on the depressed patterns of the printing plate 310. To transfer the wound cleaning dry film to the film-collecting roller 216, the cleaning roller 214 rotates in the clockwise direction. Thus, when the cleaning roller 214 rotates, the pattern material in the depressed patterns of the printing plate sticks to the cleaning dry film wound on the cleaning roller 214, whereby the pattern material is removed from the printing plate 310.

The film-collecting roller 216 collets the cleaning dry film 211 to which pattern material sticks through the cleaning roller 214. That is, the collected cleaning dry film 211 to which pattern material sticks is wound on the film-collecting roller 216.

A pattern forming method using the printing device according to the present invention will be explained with reference to FIGS. 1A to 1D, as follows.

First, as shown in FIG. 1A, the printing roller 110 is transferred to the pattern-material coating unit 400 by the transfer (not shown), and the printing roller 110 is coated with the pattern material 200 supplied from the pattern-material supplier.

Figure 1B:
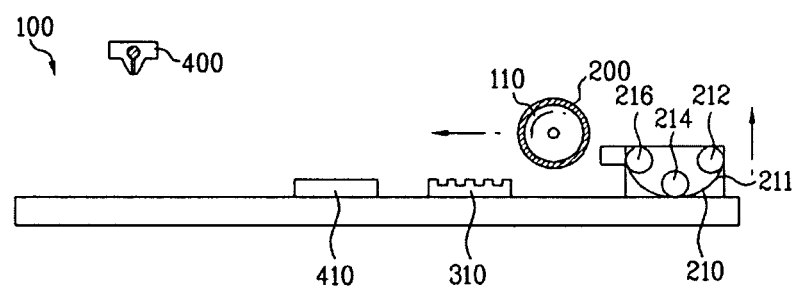

As shown in FIG. 1B, the printing roller 110 coated with the pattern material 200 is transferred to the printing plate 310 via the transfer (not shown).

Figure 1C:
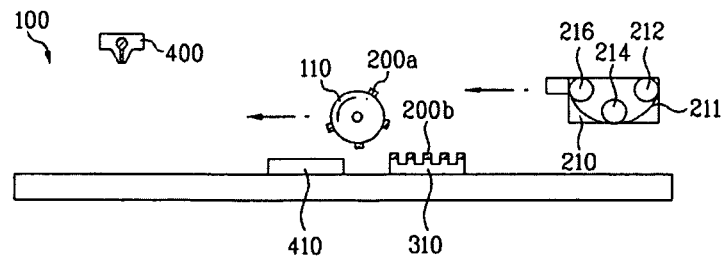

As shown in FIG. 1C, according as the printing roller 110 coated with the pattern material 200 rolls on the printing plate 310, some 200b of the pattern material is transcribed to the depressed patterns of the printing plate 310, and the other 200a of the pattern material corresponding to the embossing patterns of the printing plate 310 remain on the printing roller 110.

Figure 1D:
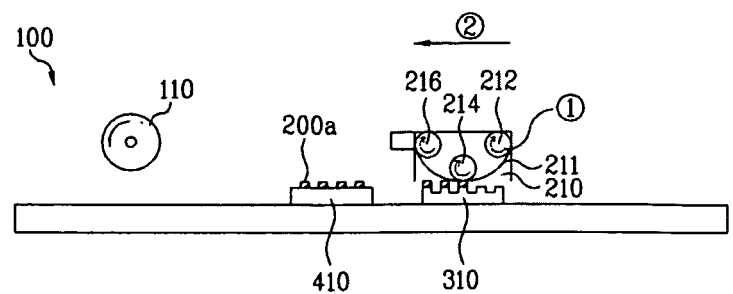

Referring to FIG. 1D, the printing roller 110 having the remaining pattern material 200a is positioned above the substrate 410 by the transfer (not shown), and the printing roller 110 rolls on the substrate 410. Accordingly, the remaining pattern material 200a on the substrate 410 is dried and cured to form the pattern.

The cleaning unit 210 is transferred to the printing plate 310 by the transfer (not shown), and the printing plate 310 is cleaned by the cleaning unit 210, thereby completing the process.

More specifically, if the cleaning roller 214 included in the cleaning unit 210 is transferred to and positioned above one side of the printing plate 310, the film-supplying roller 212, the cleaning roller 214 and the film-collecting roller 216 respectively rotate in the clockwise direction (rotation in the direction of ① of FIG. 2), and simultaneously the cleaning roller 214 rolls on the depressed patterns of the printing plate 310 from one side to the other side thereon (rotation in the direction of ② of FIG. 2).

Thus, the three rollers rotates respectively, and the cleaning roller 214 rolls on the entire surface of the printing plate including the depressed patterns therein, at the same time, whereby the pattern material of the depressed patterns of the printing plate sticks to the cleaning dry film wound on the cleaning roller 214, and the pattern material is removed from the printing plate 310. Then, the cleaning dry film 211 to which pattern material sticks is collected by the rotating film-collecting roller 216. As a result, the printing plate 310 is cleaned by the three rollers 212, 214 and 216 and the cleaning dry film 211 for combining the three rollers included in the cleaning unit 210.

In the meantime, the printing device is provided with the plurality of printing plates 310. Each of the printing plates 310 may have the individual cleaning unit 210. Instead, one cleaning unit 210 may be moved above the printing plates 310.

If removing the pattern material from the cleaning dry film 211 collected by the film-collecting roller 216, the cleaning dry film 211 can be re-used.

As mentioned above, the printing device according to the present invention and the pattern forming method using the same have the following advantages.

According as the cleaning process for the printing plate is carried out by the cleaning unit including the three rollers and the cleaning dry film for combining the three rollers, the pattern material is removed from the printing plate by the direct contact between the cleaning dry film and the depressed patterns of the printing plate, thereby decreasing the time of cleaning process. Also, the printing device according to the present invention uses the cleaning dry film instead of the related art cleaning liquid, so that it is possible to prevent the problem of increasing cost caused by the steps of supplying and discharging the cleaning liquid, and consumption of the expensive cleaning liquid.

FIGS. 3A to 3D are views of roughly illustrating a method of manufacturing an LCD device according to the preferred embodiment of the present invention.

Figure 3A:
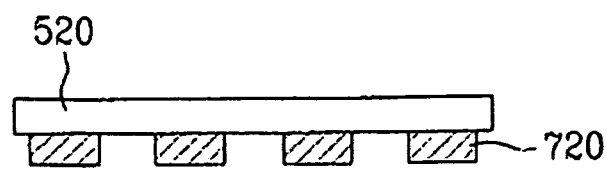
FIGS. 3A to 3D are cross section views of roughly illustrating a method of manufacturing an LCD device according to the preferred embodiment of the present invention.
Figure 3B:
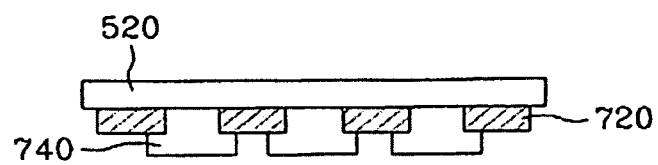

As shown in FIG. 3A, a light-shielding layer 720 is formed on a first substrate 520. Then, as shown in FIG. 3B, a color filter layer 740 is formed on the first substrate 520 including the light-shielding layer 720. At this time, at least any one of processes of forming the light-shielding layer 720 (FIG. 3A) and forming the color filter layer 740 (FIG. 3B) is carried out by the above-mentioned patterning method.

Figure 3C:
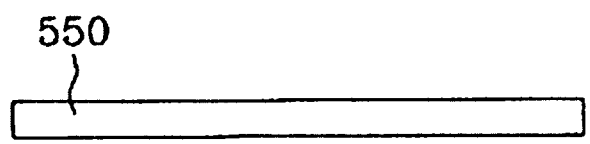

As shown in FIG. 3C, a second substrate 550 is prepared. Although not shown, the second substrate 550 is formed by steps of forming gate and data lines crossing each other to define pixel regions, forming a thin film transistor at each crossing point of the gate and data lines, and forming a pixel electrode connected with the thin film transistor.

Figure 3D:
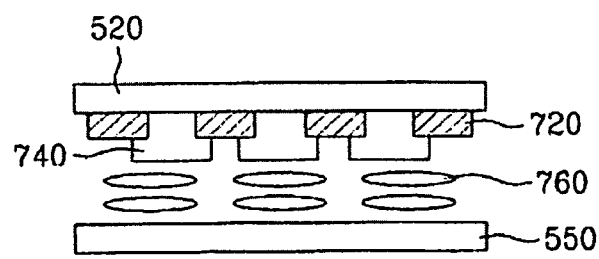

Then, a liquid crystal layer 760 is formed between the first and second substrates 520 and 550, as shown in FIG. 3D.

As mentioned above, the printing device and the method for forming pattern using the same, and the method of manufacturing the LCD device using the patterning method have the following advantages.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A pattern forming method, comprising:
    rolling a printing roller coated with a pattern material on a printing plate including embossing and depressed patterns therein, to make some of the pattern material left on the printing roller;
    rolling the printing roller having the pattern material left thereon on a substrate, to transcribe the pattern material to the substrate;
    transferring a cleaning unit including a cleaning dry film, a film-supplying roller, a cleaning roller, and a film-collecting roller to be positioned above the printing plate, where the cleaning dry film, the film-supplying roller, the cleaning roller, and a film-collecting roller being closed by lower and upper surfaces and sidewalls of the cleaning unit when transferring the cleaning unit, while the cleaning unit is in between an initial position and the printing plate, both ends of the film-supplying roller and the film-collecting roller being fixed to the sidewall of the cleaning unit; and
    cleaning the printing plate by using the cleaning dry film of the cleaning unit when the lower surface of the cleaning unit is opened,
    wherein cleaning the printing plate by using the cleaning dry film of the cleaning unit comprises:
        supplying the cleaning dry film of the film-supplying roller to the cleaning roller,
        rotating the film-supplying roller, the cleaning roller and the film-collecting roller respectively in same direction and simultaneously rolling the cleaning dry film supplied to the cleaning roller on the printing plate from one side to other side thereon, to make the pattern material of the printing plate stick to the cleaning dry film, and
        collecting the cleaning dry film, to which pattern material sticks, by using the film-collecting roller,
    wherein the cleaning dry film is formed of a film containing adhesive high molecular compound,
    wherein the adhesive high molecular compound is formed of mixture of acrylic resin and epoxy resin,
    wherein the cleaning roller has a smaller diameter than the printing roller, and
    wherein the cleaning roller has wider diameter than a line width of the depressed patterns.

2. The pattern forming method of claim 1, further comprising coating the pattern material on the printing roller before rolling the printing roller on the printing plate.

3. The pattern forming method of claim 1, wherein rolling the printing roller coated with the pattern material on the printing plate, to make some of the pattern material left on the printing roller, comprises:
    rolling the printing roller coated with the pattern material on the printing plate, to make some of the pattern material transcribed to the depressed patterns of the printing plate, and to make the pattern material corresponding to the embossing patterns left on the printing roller.

4. A method of fabricating a LCD device, the method comprising:
    preparing a thin film transistor substrate, comprising:
        rolling a printing roller coated with a pattern material on a printing plate including embossing and depressed patterns therein, to make some of the pattern material left on the printing roller;
        rolling the printing roller having the pattern material left thereon on a substrate, to transcribe the pattern material to the substrate;

transferring a cleaning unit including a cleaning dry film, a film-supplying roller, a cleaning roller, and a film-collecting roller to be positioned above the printing plate, where the cleaning dry film, the film-supplying roller, the cleaning roller, and a film-collecting roller being closed by lower and upper surfaces and sidewalls of the cleaning unit when transferring the cleaning unit, while the cleaning unit is in between an initial position and the printing plate, both ends of the film-supplying roller and the film-collecting roller being fixed to the sidewall of the cleaning unit; and cleaning the printing plate by using the cleaning dry film of the cleaning unit when the lower surface of the cleaning unit is opened;

preparing a color filter substrate;

providing a liquid crystal layer between the thin film transistor substrate and color filter substrate; and bonding the thin film transistor substrate and color filter substrate, wherein cleaning the printing plate by using the cleaning dry film of the cleaning unit comprises:

supplying the cleaning dry film of the film-supplying roller to the cleaning roller, rotating the film-supplying roller, the cleaning roller and the film-collecting roller respectively in same direction and simultaneously rolling the cleaning dry film supplied to the cleaning roller on the printing plate from one side to other side thereon, to make the pattern material of the printing plate stick to the cleaning dry film, and collecting the cleaning dry film, to which pattern material sticks, by using the film-collecting roller, wherein the cleaning dry film is formed of a film containing adhesive high molecular compound, wherein the adhesive high molecular compound is formed of mixture of acrylic resin and epoxy resin, wherein the cleaning roller has a smaller diameter than the printing roller, and wherein the cleaning roller has wider diameter than a line width of the depressed patterns.

5. The pattern forming method of claim 4, further comprising coating the pattern material on the printing roller before rolling the printing roller on the printing plate.

6. The pattern forming method of claim 4, wherein rolling the printing roller coated with the pattern material on the printing plate, to make some of the pattern material left on the printing roller, comprises:

rolling the printing roller coated with the pattern material on the printing plate, to make some of the pattern material transcribed to the depressed patterns of the printing plate, and to make the pattern material corresponding to the embossing patterns left on the printing roller.

* * * * *